United States Patent
Krayvitz (Krivts) et al.

(10) Patent No.: US 9,302,358 B2
(45) Date of Patent: Apr. 5, 2016

(54) CHAMBER ELEMENTS AND A METHOD FOR PLACING A CHAMBER AT A LOAD POSITION

(71) Applicant: APPLIED MATERIALS ISRAEL, LTD., Rehovot (IL)

(72) Inventors: Igor Krayvitz (Krivts), Rehovot (IL); Israel Avneri, Ramat Gan (IL); Yoram Uziel, Post Misgav (IL); Natan Schlimoff, Rehovot (IL); Gilad Schwartz, Meishar (IL); Yochanan Madmon, Kiryan Epron (IL)

(73) Assignee: Applied Materials Israel, Ltd., Rehovot (IL)

( * ) Notice: Subject to any disclaimer, the term of this patent is extended or adjusted under 35 U.S.C. 154(b) by 343 days.

(21) Appl. No.: 13/944,815

(22) Filed: Jul. 17, 2013

(65) Prior Publication Data
US 2014/0027968 A1    Jan. 30, 2014

Related U.S. Application Data

(63) Continuation of application No. PCT/US2011/021588, filed on Jan. 18, 2011.

(51) Int. Cl.
*B23Q 3/00* (2006.01)
*H01L 21/67* (2006.01)
*B08B 3/04* (2006.01)
*C23C 16/44* (2006.01)

(52) U.S. Cl.
CPC .............. *B23Q 3/00* (2013.01); *H01L 21/6719* (2013.01); *H01L 21/67201* (2013.01); *B08B 3/04* (2013.01); *C23C 16/4409* (2013.01); *H01L 21/6715* (2013.01)

(58) Field of Classification Search
CPC .......... B05C 11/08; B08B 3/02; B08B 3/102; B08B 3/04; C23C 16/4409; C23C 16/4405; C23C 16/401; C23C 16/45542; C23C 16/45565; H01L 21/0715; H01L 21/67017; H01L 21/6715
See application file for complete search history.

(56) References Cited

U.S. PATENT DOCUMENTS

| | | | |
|---|---|---|---|
| 6,163,033 A | 12/2000 | Smick et al. | |
| 6,846,380 B2 | 1/2005 | Dickinson et al. | |
| 6,899,765 B2 * | 5/2005 | Krivts et al. | 118/730 |
| 7,449,071 B2 | 11/2008 | Aggarwal et al. | |
| 2006/0182535 A1 | 8/2006 | Rice et al. | |

OTHER PUBLICATIONS

International Search Report for corresponding International Application No. PCT/US2011/021588 mailed on Mar. 15, 2011, 2 pages.

* cited by examiner

*Primary Examiner* — Lee D Wilson
*Assistant Examiner* — Seahee Yoon
(74) *Attorney, Agent, or Firm* — Kilpatrick Townsend & Stockton LLP

(57) ABSTRACT

Chamber elements defining a chamber include a first element having a first surface, a second element, a first dynamic seal and load mechanism. The second element includes an outer floating element that includes a second surface about the periphery of the chamber, and an inner floating element. The second surface and the first surface are maintained proximate to each other when the chamber is in a load position and when the chamber is closed. The load mechanism may move the inner floating element from the outer floating element until a gap between the inner floating element and the second element to facilitate loading of the device to the chamber. A movement system may generate relative movement between the first element and the second element.

21 Claims, 18 Drawing Sheets

CHAMBER ELEMENTS AND A METHOD FOR PLACING A CHAMBER AT A LOAD POSITION

CROSS-REFERENCES TO RELATED APPLICATIONS

The present application claims priority to and is a continuation of International Patent Application PCT/US2011/021588, filed Jan. 18, 2011. The contents of this application are hereby incorporated by reference.

FIELD OF THE INVENTION

The present invention relates to the field of semiconductor device metrology and inspection, and, more specifically, to chambers for processing, metrology or inspection of devices such as semiconductor wafers, reticles, and the like, for manufacture of integrated circuits.

BACKGROUND OF THE INVENTION

Semiconductor devices are fabricated by processes that involve depositing, patterning, and removing of materials on substrates. Deposition processes such as chemical vapor deposition (CVD) or physical vapor deposition (PVD) may be used to deposit a layer of material on a substrate. Photolithography techniques may be used to create a pattern on a layer of material to control where etching, depositing, or implanting will occur.

Etch processes may be used to remove portions of a deposited layer, so that other materials may be deposited in the removed portions. Ion implantation processes may be used to change the properties of a deposited layer of material by physically bombarding and implanting dopants into the deposited layer. By using various ones of these process steps, semiconductor devices, and, thus, integrated circuits are created on the substrate.

In fabricating integrated circuits (ICs), specialized process chambers are used sequentially to perform the steps required to build the semiconductor devices and the ICs. Each chamber usually has an inner chamber in which predefined conditions, such as a certain vacuum level, are maintained during the process.

For a complex integrated circuit, hundreds of individual process steps may be involved in building and interconnecting all of the underlying semiconductor devices. To streamline the manufacturing process, process chambers may be integrated into a cluster tool, so that the different process steps may be executed sequentially and efficiently, using less factory space than stand-alone chambers, and requiring less distance to transport wafers from process step to process step. A cluster tool provides process sequence integration by "clustering" several different process chambers into one platform.

In some inspection tools and process chambers a device such as a substrate is moved along various directions during the inspection, metrology or manufacturing process, respectively.

The inspection/inspection tool/process chamber has a chamber in which various predefined conditions such as a certain vacuum level are maintained. When some processing chambers are integrated into a cluster tool the substrate may be shifted from one process chamber to another without the need to break pressure seals in the process environment.

As a result, there may be fewer opportunities for unwanted contamination to occur. In addition, it is possible to save some or all of the time involved in completely venting a chamber, moving a substrate from stand-alone chamber to stand-alone chamber, and then pumping down each succeeding chamber to achieve the necessary level of vacuum to conduct the next process sequence.

Because of the complexity of the manufacturing process, there is frequent inspection of substrates to ensure that the process steps are executed property and that the substrates are reasonably free of defects, preferably as free of defects as is practicable. Currently, processing and inspection/metrology of semiconductor substrates are done separately, in stand-alone tools.

BRIEF SUMMARY OF THE INVENTION

The inventors have recognized a need to provide methods and systems for the integration of an inspection/metrology tool into a cluster tool. An inspection/metrology chamber that can be integrated into a cluster tool would further streamline the manufacturing process for integrated circuits.

The inventors have further recognized a need to provide a chamber that may be pumped down rapidly, and yet a further need for an efficient and relatively contamination-free system and method for moving a substrate while maintaining predefined conditions within a chamber in which the substrate is placed.

According to an embodiment of the invention, chamber elements defining a chamber are provided. The chamber can be used during a manufacturing stage of a device and an inspection/metrology of the device. The chamber elements may include: (a) a first element, that may include at least an upper plate, having a first surface; (b) a second element, that may include at least an outer floating element, the second element may have a second surface about the periphery of said chamber; (c) at least one dynamic seal; (d) a load mechanism arranged to position the chamber in a load position and which may be arranged to close the chamber. The chamber elements are operable to partially surround a first portion of a movement system. The movement system may be arranged to generate a first relative movement between said first element and said second element. When the chamber is closed the first and second surfaces are proximate to each and the first dynamic seal may be arranged to maintain predefined conditions in the chamber during the first relative movement. When the chamber is in the load position a loading of the device to the chamber and an unloading of the device from the chamber are facilitated. The load mechanism may include an adjustable height element and, additionally or alternatively, a closed loop height adjustment element.

The load mechanism may be arranged to increase a distance between the first and second surfaces until the chamber is in the load position.

The chamber elements may include a vacuum unit that may be arranged to introduce a pressure difference between the chamber and an environment of the chamber.

The first dynamic seal may be arranged to maintain the predefined conditions wherein a distance between the first and second surfaces is smaller that a first distance. The load mechanism may be arranged to place the first and second surfaces at a first distance from each other. A pressure difference between the chamber and an environment of the first chamber may cause the first surface to move within the first distance from the second surface.

The second element may include an outer floating element that may include the second surface and a bottom surface. The load mechanism may include a pneumatic actuator (cylinder) and the adjustable height element. The first end of the adjustable height element may be connected to the pneumatic cylinder and the second end of the adjustable height element may be connected to the bottom surface of the chamber. A distance between the first and second ends of the adjustable height element is adjustable. The load mechanism may be arranged to place the first and second surfaces at the first distance from each other.

The pneumatic cylinder may include a piston and an elastic stop that may be positioned to prevent the piston from elevating the first element such as to cause the first surface to contact the second surface.

The chamber elements may include a closed loop height adjustment element such as an electro mechanical actuator that is responsive to distance measurements made by a sensor that may be arranged to sense the distance between the first and second surfaces.

The first element may include an upper plate, a base and a vibration isolation system, having a first end mounted to the base and a second end mounted to the upper plate, supporting the upper plate and isolating the upper plate from vibration.

The load mechanism may include multiple distance changing elements that surround the chamber.

The second element may include (a) an outer floating element that may include the second surface; and (b) an inner floating element. The second surface and the first surface are maintained proximate to each other when the chamber is in the load position. The load mechanism may be arranged to move the inner floating element from the outer floating element until a gap between the inner floating element and the second element facilitates a loading of the device to the chamber.

The second element may include a device support element. The movement system may include a z-stage arranged to alter a height of the device support element within the chamber when the chamber is closed.

The movement system may include multiple actuators that are arranged to move the inner floating element and surround the z-stage.

The load mechanism may include a supporting element that places the outer floating element in proximity to the first element.

The movement system may include the load mechanism.

The load mechanism may be separate from the movement system.

The first dynamic seal may be maintained by a flow of gas between a group of air bearings and multiple vacuum grooves. The group of air bearings may surround the multiple vacuum grooves.

The first dynamic seal may be maintained by a flow of gas between a vacuum groove and multiple vacuum grooves, wherein the vacuum groove surrounds the multiple vacuum grooves.

Further embodiments of the invention provide a method for loading a device into a chamber during a processing or an inspecting of the device, and said method may include: (a) positioning a chamber in a load position, wherein the chamber may be defined by a first element having a first surface and a second element that may include a second surface about the periphery of said chamber, wherein the second element may be operable to partially surround a first portion of a movement system, and wherein the movement system may be arranged to generate a first relative movement between said first element and said second element; and (b) closing the chamber by a load mechanism; wherein when the chamber is closed the first and second surfaces are proximate to each and a first dynamic seal may be arranged to maintain predefined conditions in the chamber during the first relative movement.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings, in which.

DETAILED DESCRIPTION OF THE INVENTION

Figure 1A:
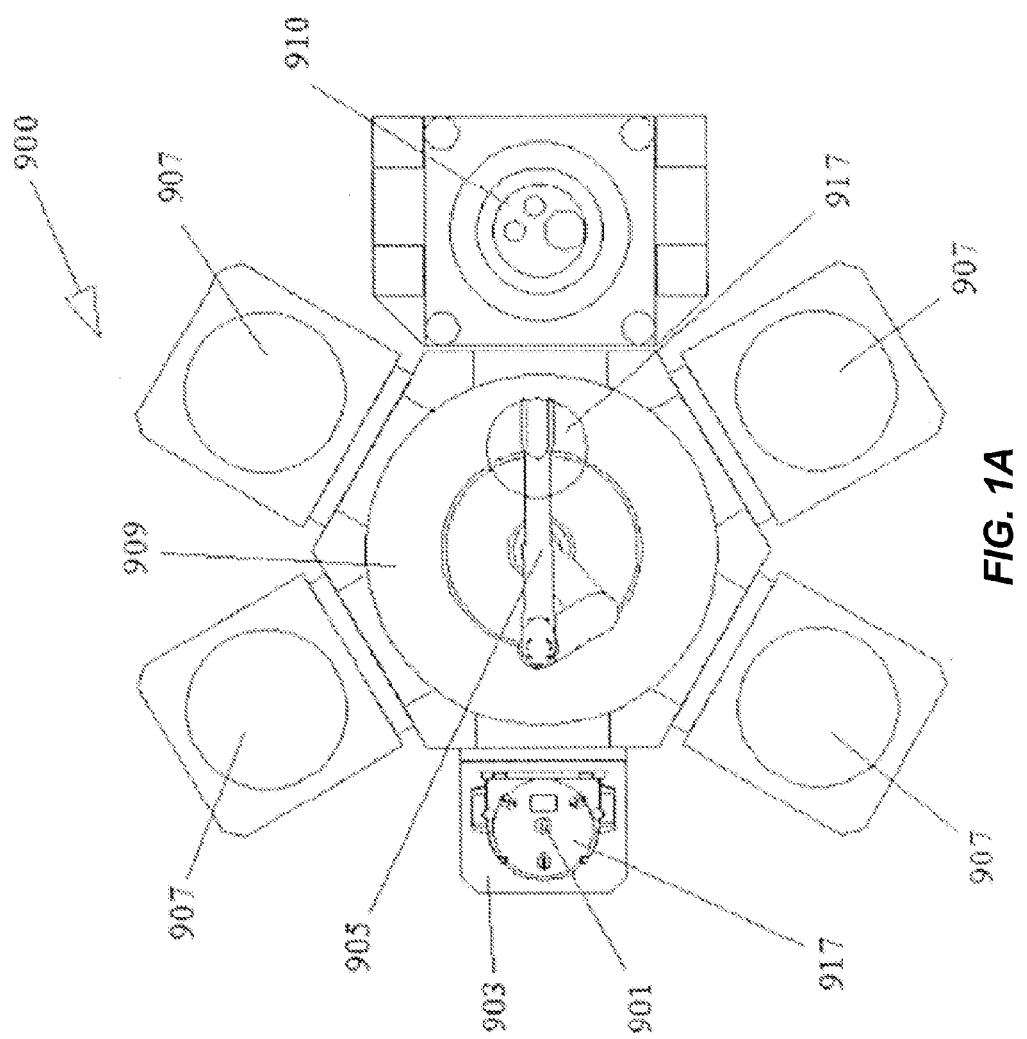
FIG. 1A shows a top view of one embodiment of a cluster tool, which includes a load lock, a transfer chamber, process chambers, and an inspection chamber, in which the present invention may be implemented.

It should be appreciated that for simplicity and clarity of illustration, elements shown in the figures have not necessarily been drawn to scale. For example, the dimensions of some of the elements may be exaggerated relative to other elements for clarity. Further where considered appropriate, reference numerals may be repeated among the figures to indicate corresponding or analogous elements.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

Multiple chamber elements are provided. These chamber elements, once assembled, may provide high serviceability both for a device such as a semiconductor substrate and mechanisms that are situated within the chamber.

These chamber elements, once assembled, may provide high reliability in/for a device handling process.

These chamber elements, once assembled, may provide a high safety level for an internal chamber motion process, both in the vertical and horizontal directions.

Referring to FIG. 1A, in cluster tool 900, devices such as substrates 917 are transported in a wafer cassette 901. The wafer cassette 901 is loaded into a load lock 903, which then is sealed from outside pressure. One or more vacuum pumps (not shown) connected to the load lock 903 may pump down the load lock 903 to a desired pressure level that may approximate the pressure level in transfer chamber 909.

Transfer robot 905 picks up a substrate 917 from the wafer cassette 901 and loads the substrate 917 into any of the process chambers 907 in the cluster tool 900. Depending on the process chamber 907 into which the substrate 917 is inserted, material may be deposited on, or patterned on, or removed from the substrate 917.

FIG. 1A illustrates an inspection chamber 910 having an internal chamber (such as the chamber of FIGS. 1C-7 and 12) that is integrated into a cluster tool 900. Inspection chamber 910 includes a Scanning Electron Microscope (SEM) and an optical microscope that may be positioned so as to inspect substrates that are located within the chamber of FIGS. 1C-7 and 12. In these figures the SEM is denoted 207, the optical microscope is denoted 78 and the turbo vacuum pump is denoted 211.

As discussed above, once the load lock doors are closed, the cluster tool 900 including the load lock 903, the transfer chamber 909, the process chambers 907, and the inspection chamber 910 may be sealed from the ambient environment.

The substrate 917 may be transferred from the load lock 903 to any process chamber 907, and from one process chamber 907 to another process chamber 907 under a controlled pressure level, including various levels of vacuum. The pressure levels within the load lock 903, the transfer chamber 909, each of the process chambers 907 and the inspection chamber 910 may be maintained at substantially the same or different pressure levels, as desired, depending on the needs of the particular process in a given chamber 907.

Figure 1B:
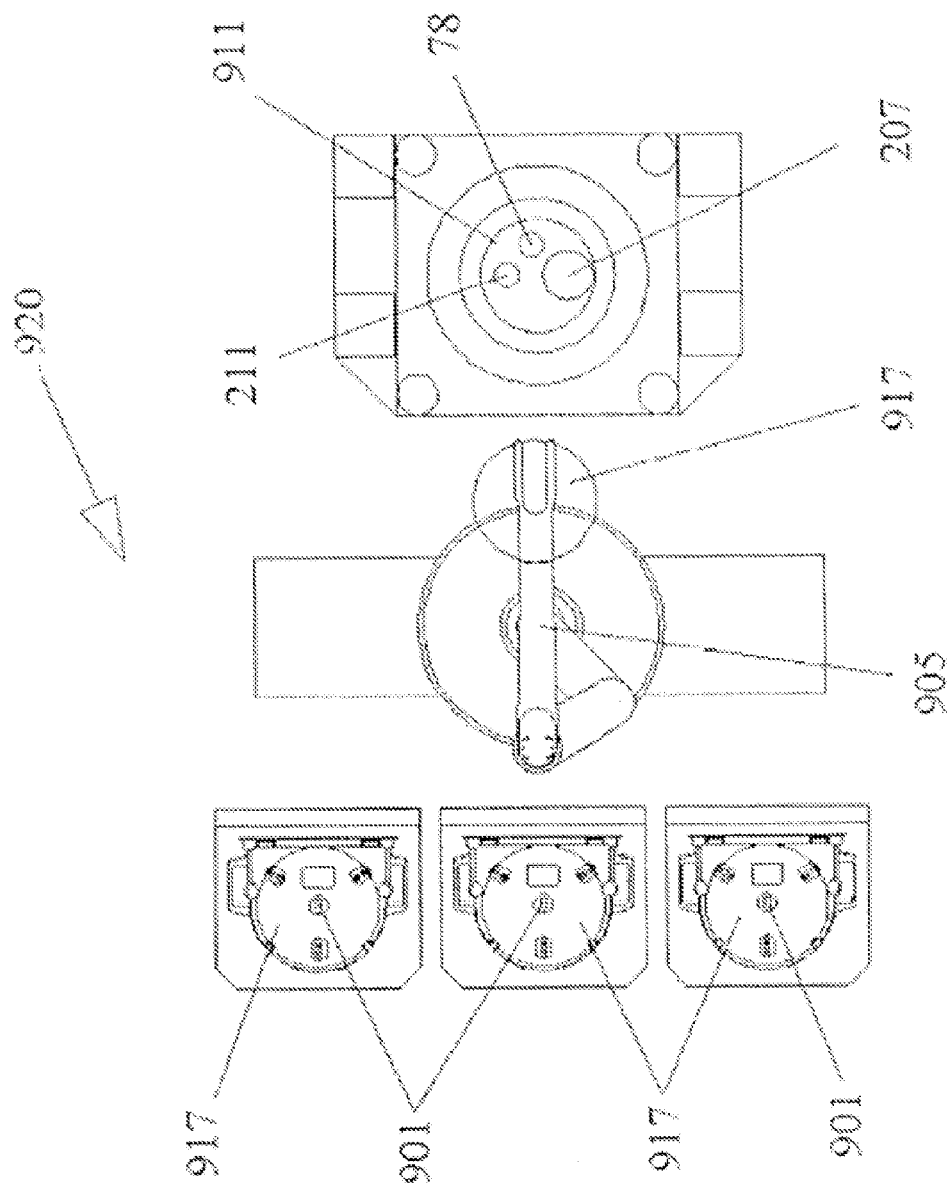
FIG. 1B shows a top view of one embodiment of a stand-alone tool, which includes a inspection chamber, wafer cassettes, and a transfer robot, in which the present invention may be implemented.

FIG. 1B illustrates a stand-alone inspection chamber 911 having an internal chamber (not shown). Inspection chamber 911 includes a SEM 207 and an optical microscope 78. Both may be mounted on the inspection chamber 920 so as to inspect substrates 917 located within the internal chamber. Transfer robot 905 picks up a substrate 917 from the wafer cassette 901 and loads the substrate 917 into the inspection chamber 920.

Figure 1C:
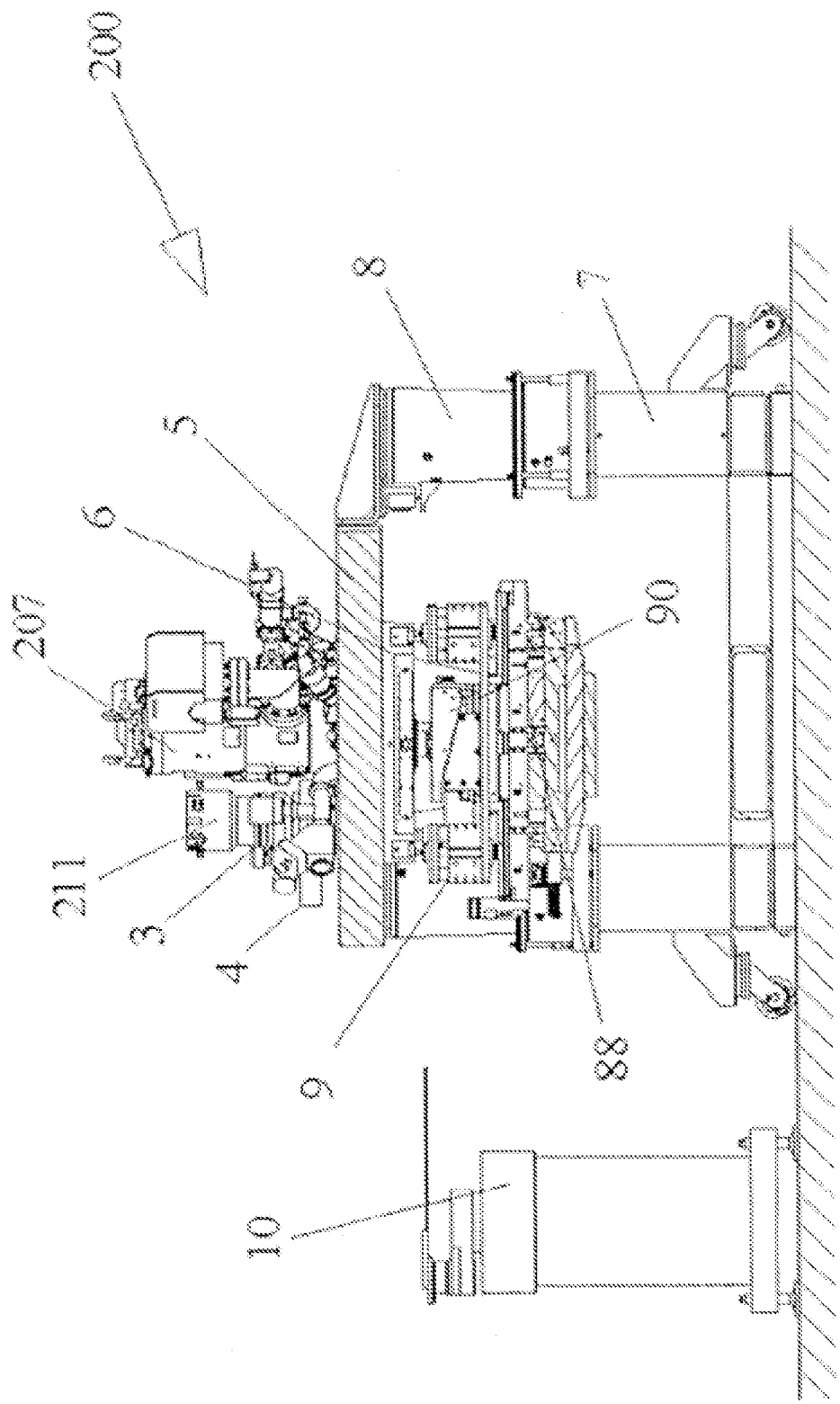
FIG. 1C is a cross section of a system that includes chamber elements according to an embodiment of the invention.

FIG. 1C is a cross sectional view of a system 200 that includes chamber elements according to an embodiment of the invention.

The cross section is taken along an imaginary plane that does not cross the center of system 200.

System 200 includes SEM 207, a turbo molecular vacuum pump 211 for pumping down the chamber, a damper 3, a valve 4, an upper plate 5 and an outer floating element 6.

The outer floating element 6 is floating in the sense that is it not rigidly fixed to the upper plate 5 or to a movement system. Its exact position can be at least partially affected by a dynamic seal, a pressure difference and the like. The outer floating element 6 can be moved in relation to the upper plate 5.

Figure 2:
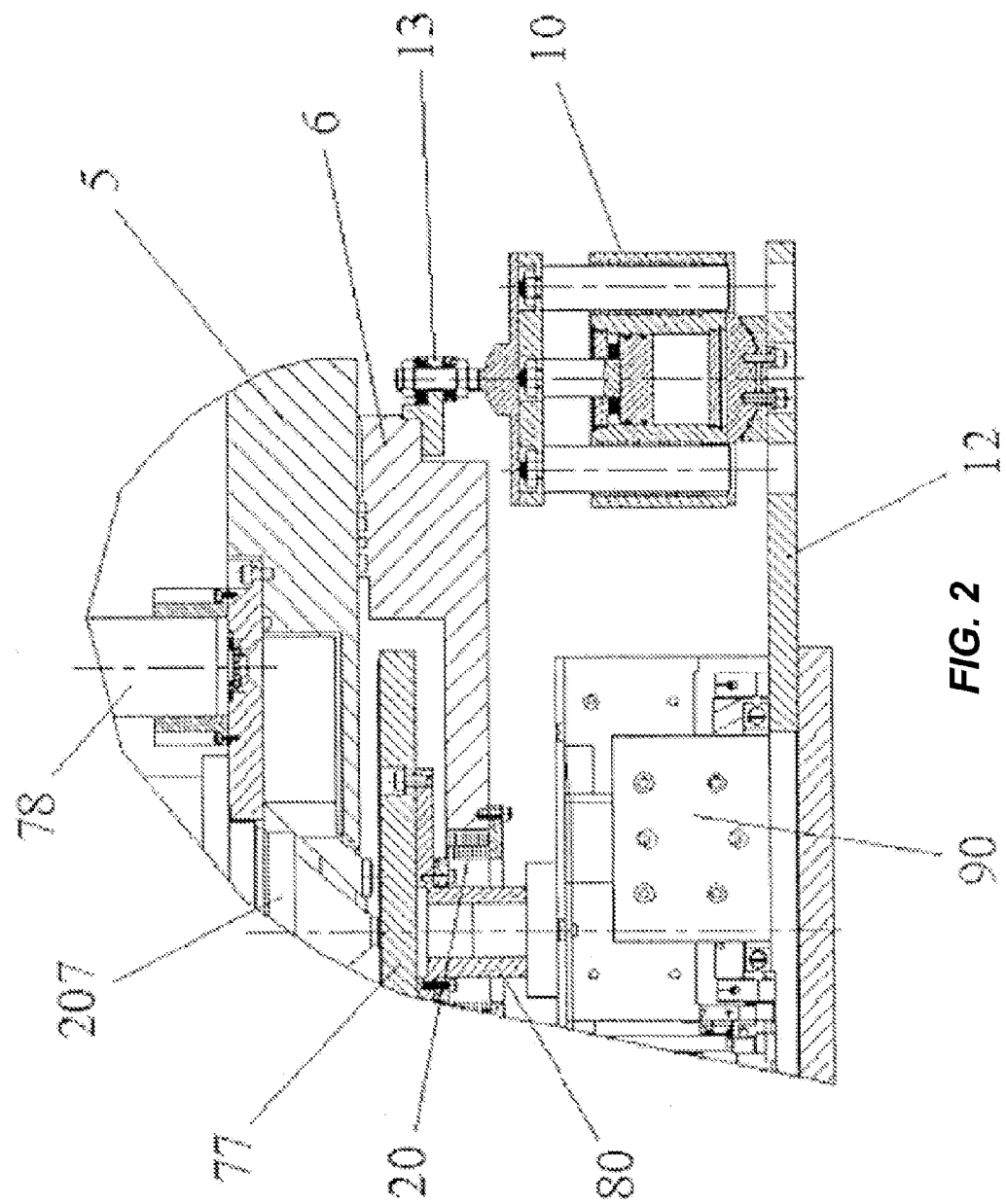
FIG. 2 is a cross sectional view of a portion of a system according to an embodiment of the invention.

The outer floating element 6 is outer in the sense that it at least partially surrounds at least one other element of system 200, such as an inner floating element (not shown in FIG. 1C), a rod 80 of a moving mechanism (see FIG. 2), or a device supporting element (denoted 77 in FIG. 2).

The upper plate 5 and the outer floating element 6 may define the chamber although the chamber can be defined by additional chamber elements.

According to an embodiment of the invention, illustrated in FIGS. 1A-4, when the chamber is closed, the outer floating element 6 is proximate to the upper plate 5. Especially a first surface (denoted 92 in FIG. 9) of the upper plate 5 is proximate to a second surface (denoted 91 in FIG. 9) of the outer floating element 6. Either one of these surfaces (or both surfaces) can be grooved to allow the passage of gas from one groove to another and thereby form a first dynamic seal.

When the chamber is in a load position these first and second surfaces are spaced apart (distant) from each other and a gap between the upper plate 5 and the outer floating element 6 can facilitate loading and unloading of a device to the chamber and from the chamber, respectively.

Figure 9:
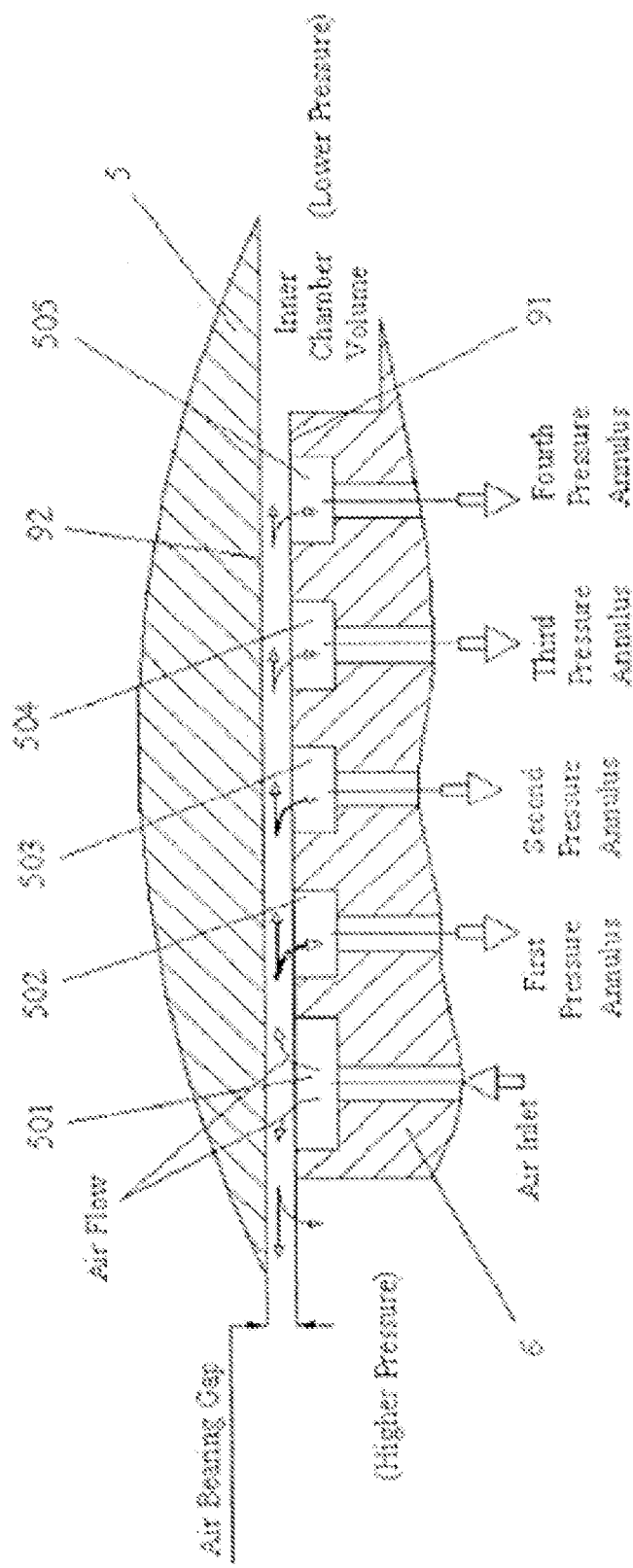
FIG. 9 is a cross sectional view of portions of the first and second surfaces according to an embodiment of the invention.

As indicated above, a first dynamic seal can seal the chamber when the upper plate 5 and the outer floating element 6 are proximate to each other. An example of the first dynamic seal is shown in FIG. 9. A non-limiting example of such a dynamic seal is illustrated in U.S. Pat. No. 6,899,765 of Krivts et al., which is incorporated herein by reference.

System 200 may include a three-axis stage, such as an XYZ stage. FIG. 1C illustrates a z-stage 90 that is supported by an X-Y stage 88. The XYZ stage may move a device (not shown) while the device is within the chamber and while predefined conditions (such as vacuum level, humidity, and the like) are maintained in the chamber.

The XY-stage 88 is a part of a moving system that moves the device as well as the outer floating element 6 in relation to the upper plate 5 while predefined conditions are maintained in the chamber, it is noted that the XY stage 88 can be replaced by any other stage(s) that can move the device and chamber elements in relation to the upper plate 5. Non-limiting examples of such stages can include a radial movement stage and a tangential movement stage.

It is noted that the device can be supported by a one-degree of freedom stage, a two-degree of freedom stage, a four-degree of freedom stage or any other stage.

The device can be inspected by the SEM 207 or by an optical microscope 78 while being moved by the XYZ stage. Additionally or alternatively, the device can be milled by an ion mill or otherwise processed by another tool while being located within the chamber.

FIG. 1C illustrates a load mechanism such as load mechanism 9. The load mechanism of FIG. 1C is illustrated as being mounted on a part of the XYZ stage. The load mechanism 9 can change the location(s) of one or more chamber elements to allow the device to be loaded to the chamber or unloaded from the chamber.

The chassis 7 and the vibration isolation system 8 are intended to the support the whole mechanical platform including, for example, the upper plate 5.

FIG. 1C also illustrates an external robot 10 that may load the device to the chamber and unload the device from the chamber. The external robot 10 can also include a pre-aligner that is not shown in FIG. 1C.

Conveniently, the first surface is at least a portion of a lower surface of the upper plate 5. The upper plate 5 may also include an upper surface on which various components such as the turbo pump 211 and the SEM 207 are mounted. Other components such as interferometers and an optical microscope (not shown in FIG. 1C) can also be mounted on the upper plate 5.

According to various embodiments of the invention the opening of the chamber can be performed with feedback {closed loop configuration} or without feedback (open loop configuration).

Figure 1D:
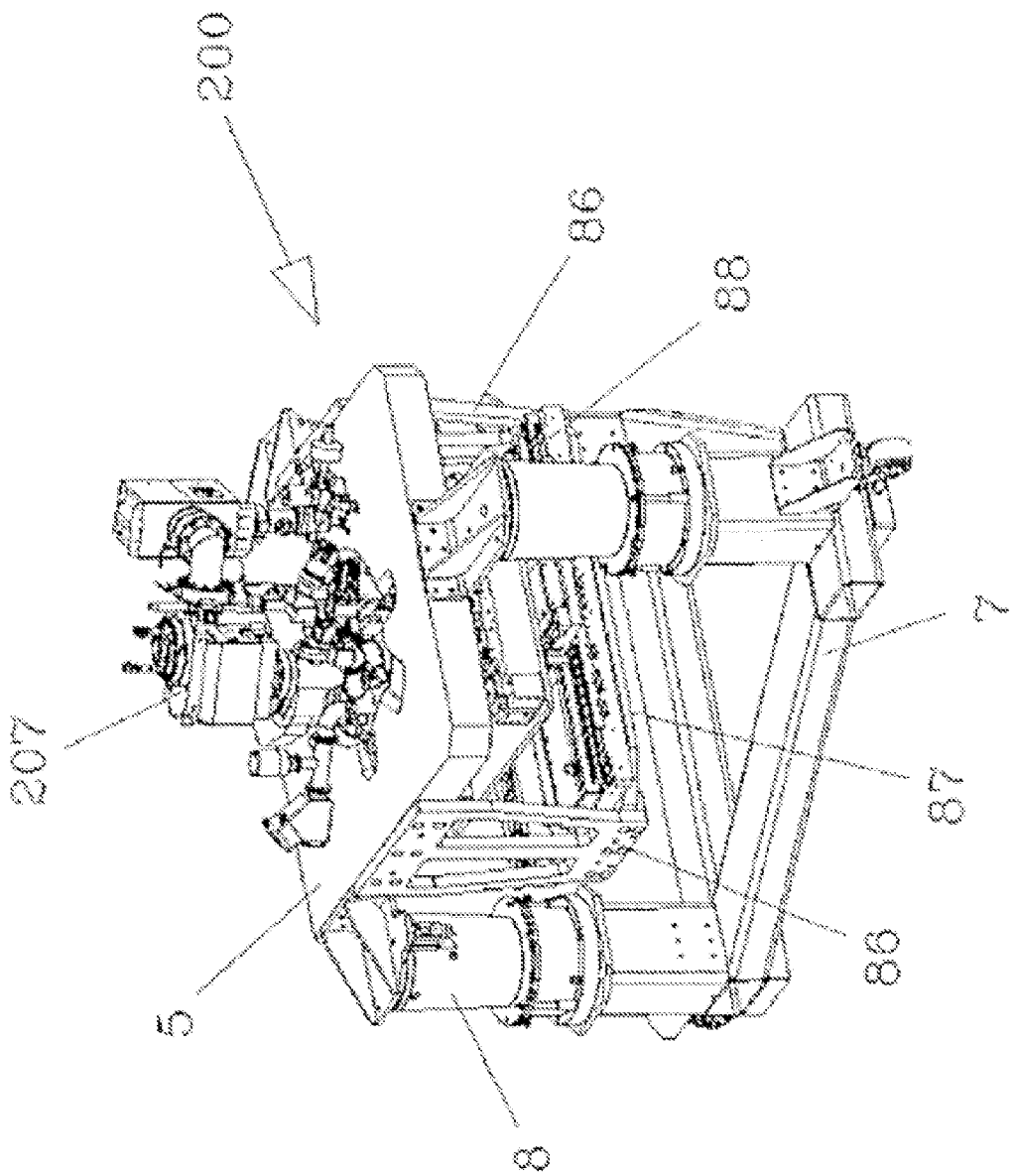
FIG. 1D shows a isometric view of a system, which includes a position stage with its base and two supports that are connected to and upper plate according to an embodiment of the invention.

FIG. 1D is an isometric view (from a back side} of system 200 (without transfer robot 905), according to an embodiment of the invention. An X-Y stage 88 is mounted on stage base 87 that is connected to the upper plate 5 via two base supports 86. The X-Y stage 88 can move the inspected object in relation to the stage base 87. It is noted that the X-Y stage 88 can be connected to other portions of the system—including by supporting elements that may be positioned below the XY-stage 88.

Figure 3:
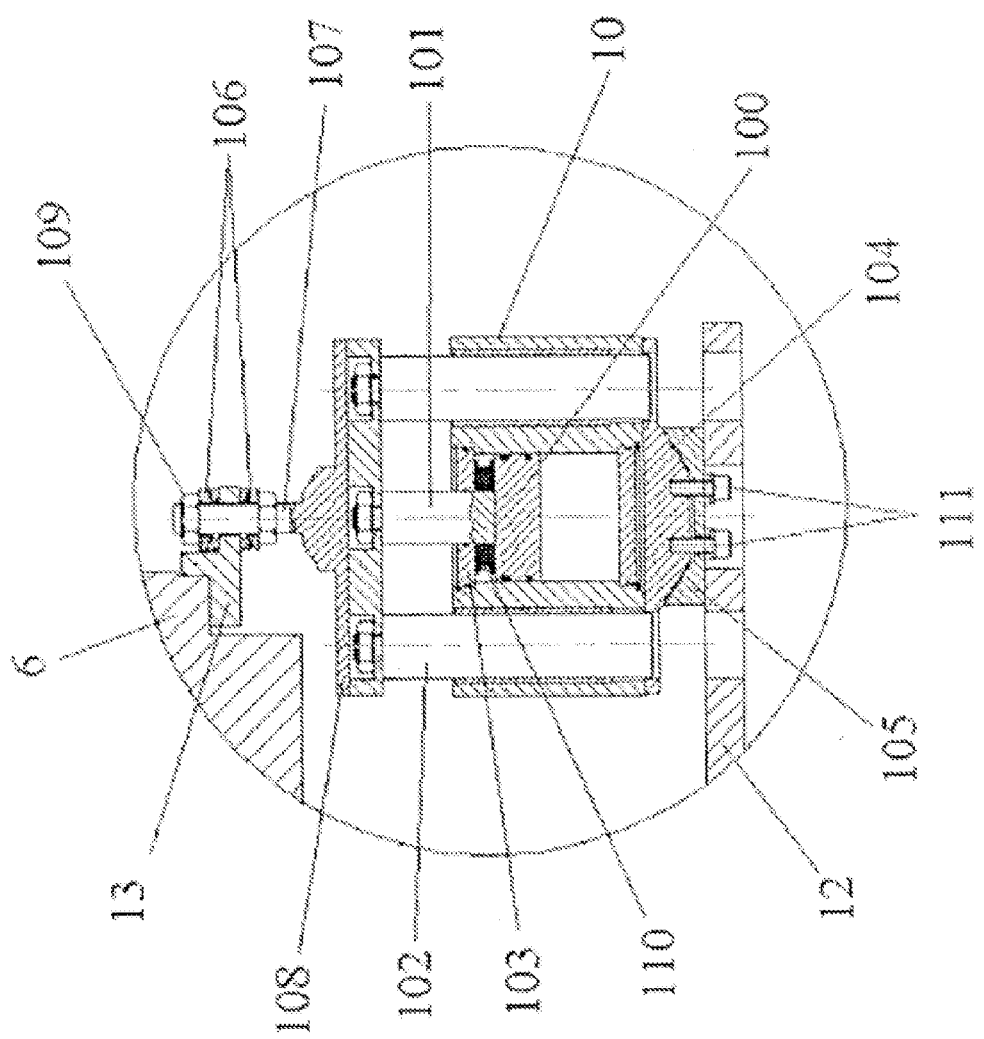
FIG. 3 is a cross sectional view of a guided pneumatic cylinder according to an embodiment of the invention.
Figure 4A:
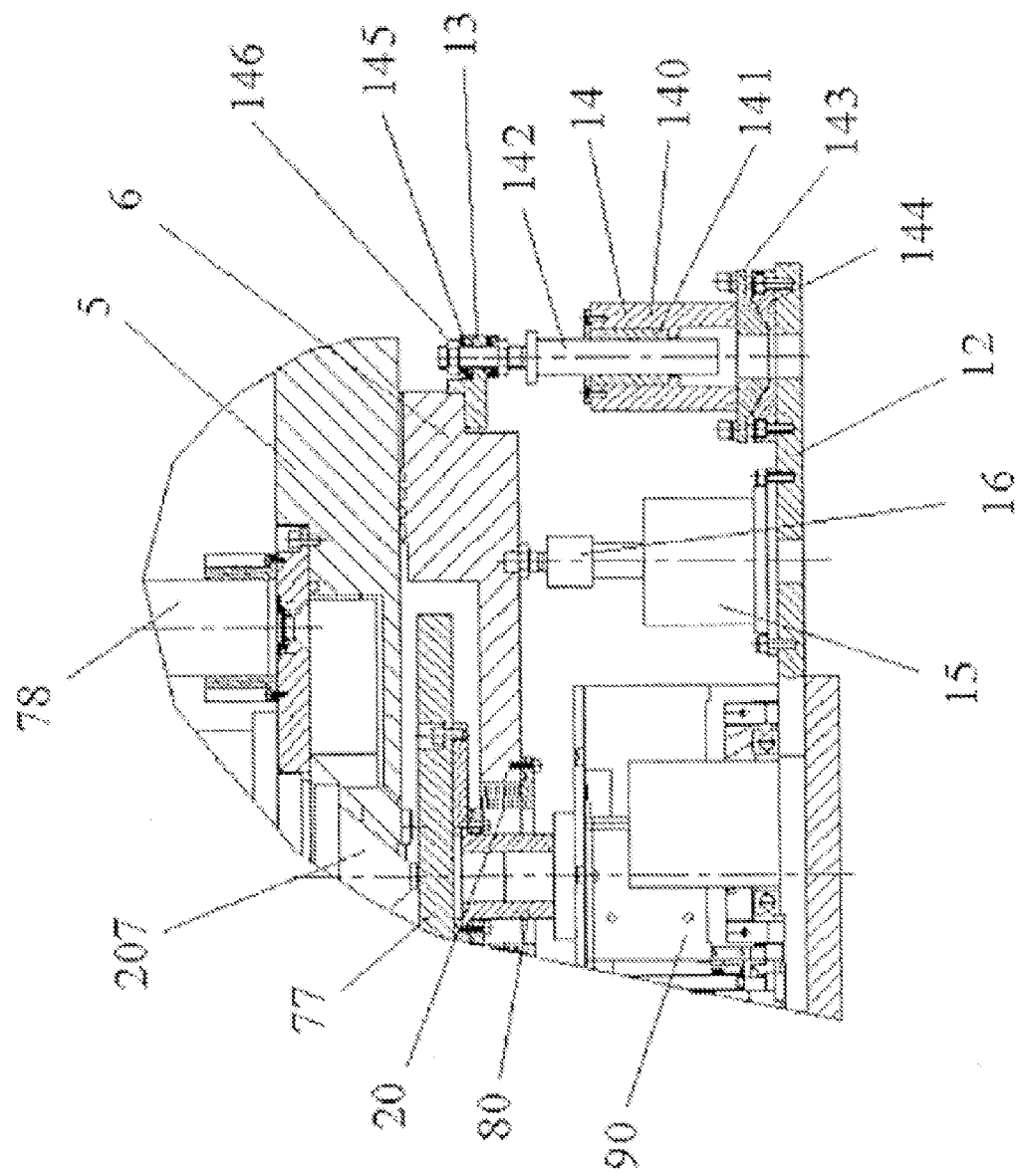
FIG. 4A is a cross sectional view of a portion of a system according to an embodiment of the invention.

FIGS. 2-3 illustrate an embodiment of an open loop configuration while FIG. 4A illustrates a closed loop configuration. Each of the open loop configuration and the closed loop configuration can be implemented using various chamber components. FIGS. 2-3 illustrate a load mechanism that includes a pneumatic cylinder, while FIG. 4A illustrates an electro mechanical actuator.

FIG. 2 is a cross sectional view of a portion of system 200 according to an embodiment of the invention. The portion includes a guided pneumatic cylinder 10, a portion of upper plate 5, a portion of the outer floating element 6, a portion of a device supporting element 77, a portion of the chamber, a portion of the moving mechanism (Z-stage) 90, a portion of an optical microscope 78, a rod 80 of the moving mechanism 90 and a first flexible structure 20 that connects the outer floating element 6 and the rod 80.

The first flexible structure 20 can be a bellows. The first flexible structure 20 may maintain the predefined conditions within the chamber even when the outer floating element 6 and the rod 80 move in relation to each other.

The guided pneumatic cylinder 10 can mounted on a base plate 12, which is mounted on a table of a Y-axis stage or on a table of an X-axis stage of the XYZ stage.

The z-stage 90 of the XYZ stage is also mounted on the base plate 12. The outer floating element 6 is connected to the guided pneumatic cylinder 10 via connection bracket 13.

FIG. 3 is a cross sectional view of guided pneumatic cylinder 10 according to an embodiment of the invention.

The guided pneumatic cylinder 10 may include at least some of the following components:

a. A piston 100;
b. A connecting rod 101 that is connected to the piston 100;
c. A coupling plate 108;
d. Two guiding rods 102 that are parallel to the connecting rod 101 and are connected to the coupling plate 108;
e. An upper cover 103 that defines the upper border of an upper portion of the space in which the piston 100 reciprocates;
f. A spherical plate 104 that defines the lower border of a lower portion of the space in which the piston 100 reciprocates (the piston can be moved by introducing a pressure difference between the upper and lower portions of the space);
g. A support base 105, wherein the spherical plate 104 is mounted on the support base 105 and both support base 105 and the spherical plate 104 are mounted on the base plate 12; and
h. An elastic stop 110, which is mounted between the piston 100 and the upper cover 103, that may allow the chamber to be closed with no collision between the outer floating element 6 and the bottom surface of the upper plate 5. An elastic stop can be several disc springs that is DIN 2093 compatible, for instance.

The connection bracket 13 can be connected to an adjustable height element capable of adjusting the distance between one end that is connected to the outer floating element 6 and another end that is connected to the guided pneumatic cylinder 10, The adjustable height element may include two spherical washer units 106, fixing nuts 109 and a coupling rod 107. The connection bracket 13 can have a hole that is slightly larger than the cross section of the coupling rod 107. The connection bracket 13 may be positioned between the pair of fixing nuts 19 so that the rotation of the fixing nuts 19 may change the spatial relationship between the connection bracket 13 (and the outer floating element 6) and the guided pneumatic cylinder 10.

The adjustment of the adjustable height element is very simple and can be carried in order to place the first and second surfaces a desired distance (for example about 200-300 microns) from each other.

Basically, the pneumatic guided cylinder 10 can move the vacuum chamber in vertical direction load processes. The pneumatic guided cylinder 10 can also provide the movement of the floating element 6 from the XY-stage in horizontal directions via the guiding rods 102—thus, the floating element 6 may move along an X-axis and a Y-axis by a XY stage via the guiding rods 102.

The chamber can be closed by performing the following steps:

a. Elevating the outer floating element by one or more (for example, three or more) guided pneumatic cylinders.

b. When the piston reaches the elastic stop, the pressure in the lower portion of the space in which the piston moves may reach a maximum level; the piston contacts the elastic stop, which prevents further elevation of the piston so that the gap between the first and second surfaces reaches a desired value that may be between 200-300 microns. It is noted that the desired value can be defined by adjusting the adjustable height element. The adjustment can be performed during an initialization step.

c. The first dynamic seal does not operate with such gaps and there is a need to reduce the gap. This is achieved by introducing a pressure difference so that the chamber is placed at a lower pressure level than the environment of the chamber. This can include introducing vacuum into the chamber, i.e., pumping gas from the chamber while maintaining the environment outside the outer floating element 6 at an atmospheric pressure level. At the end of this process the gap between the first and second surfaces is small enough to enable the first dynamic seal to operate. The gap can be about 8-12 microns.

d. When the gap is small, the first dynamic seal operates in an efficient manner. It is noted that the first dynamic seal can be activated before the gap is reduced, but in such cases the first dynamic seal is less effective.

By preventing an actual contact between the surfaces this closing process guarantees the integrity of these surfaces. This closing process can be performed even when the pneumatic cylinders have asynchronous vertical motion.

According to another embodiment of the invention, the load mechanism includes one or more sensors for providing feedback and a servo electro-mechanical actuator for changing the height of the outer floating element 6 and other chamber elements.

FIG. 4A is a cross sectional view of a portion of system 200 according to an embodiment of the invention. The portion includes an electro-mechanical actuator lifting stage 15, a kinematic joint 16, a guided slide unit 4, a portion of upper plate 5, a portion of the outer floating element 6, a portion of a device supporting element 77, a portion of the chamber, a portion of the moving mechanism 90, a portion of an optical microscope 78, a rod 80 and a first flexible structure 20 connecting the outer floating element 6 and the rod 80.

Although not illustrated in FIG. 4A, the outer floating element 6 can be supported and vertically moved by multiple guided slide units 14 and multiple electro-mechanical actuator lifting stages 15.

Each slide unit 14 may include a housing 140, a slide bushing 141 (such as a slide bushing of type TK20UU available from Nippon Bearing Co., Ltd. of Ojiya city, Niigata Prefecture, Japan), a rod 142, a spherical plate 143 and a support base 144. The support base 144 can be mounted on the base plate 12. The slide unit 14 may include two spherical washer units 145 and fixing nuts 109 for providing a kinematic joint between rod 142 and connection bracket 13.

Electro-mechanical actuator lifting stage 15 and kinematic joint 16 provide an accurate vertical motion capability of the outer floating element 6 and this accurate vertical motion can change the gap between the first and second surfaces between about 25-30 mm (so that the chamber is at a load position) and about 8-12 microns (when the chamber is closed). It is noted that these distances are provided as a non-limiting examples.

When the chamber is closed, the gap should be small enough to allow the force balance between air bearing and vacuum (and maintain predefined conditions in the chamber) without causing the first and second surfaces to contact each other. When the chamber is in a load position, the gap should be large enough to facilitate loading and unloading of a device to the chamber and from the chamber, respectively.

Once the first dynamic seal operates, the gap between the outer floating element 6 and the upper plate 5 is determined by the first dynamic seal and especially by a balance between gas introduced to an interface defined between the first and second surfaces and the gas evacuated from the interface.

One or more sensors (which may be position sensors) of the electro-mechanical actuator 15 may be mounted either on the actuator or on the guided slide units 14.

Figure 4B:
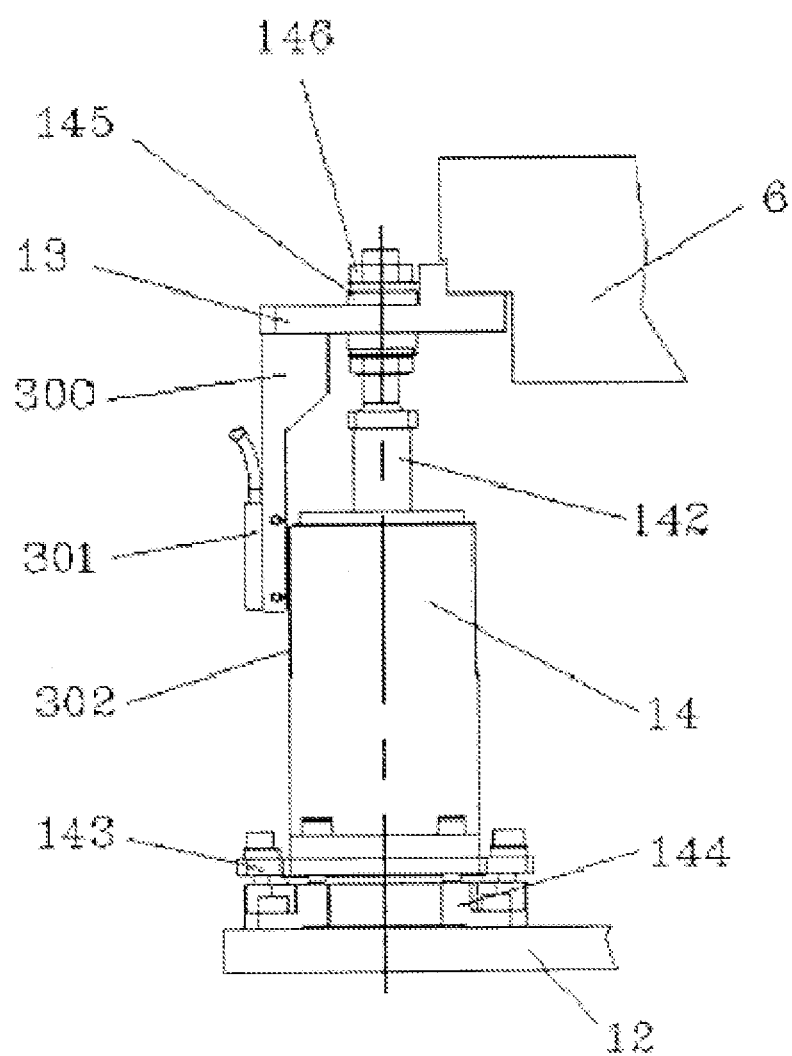
FIG. 4B is a side view of a portion of the guided slide unit and the outer floating element 6 shown in FIG. 4A according to an embodiment of the invention.

FIG. 4B is a side view of a portion of guided slide unit 14 and the outer floating element 6 according to an embodiment of the invention. The sensor bracket 300 is mounted on the connection bracket 13 and it holds the sensor head reader 301. The sensor scale 302 is mounted on the guided slide unit 14. in other instances, the position sensor may be an integral part of the electro-mechanical actuator 15.

Figure 5:
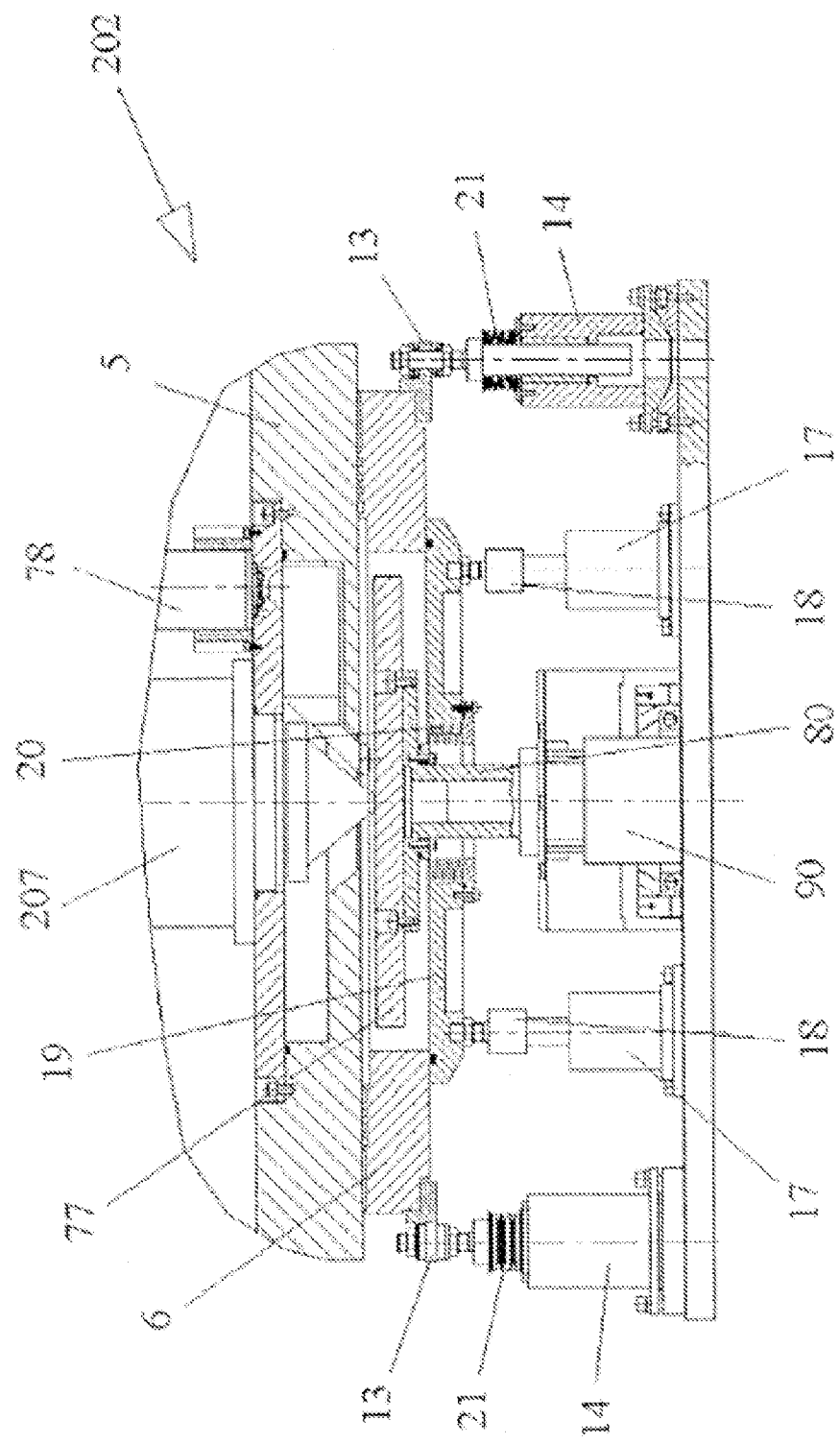
FIGS. 5 and 6 are cross sectional views of a portion of a system according to an embodiment of the invention.
Figure 6:
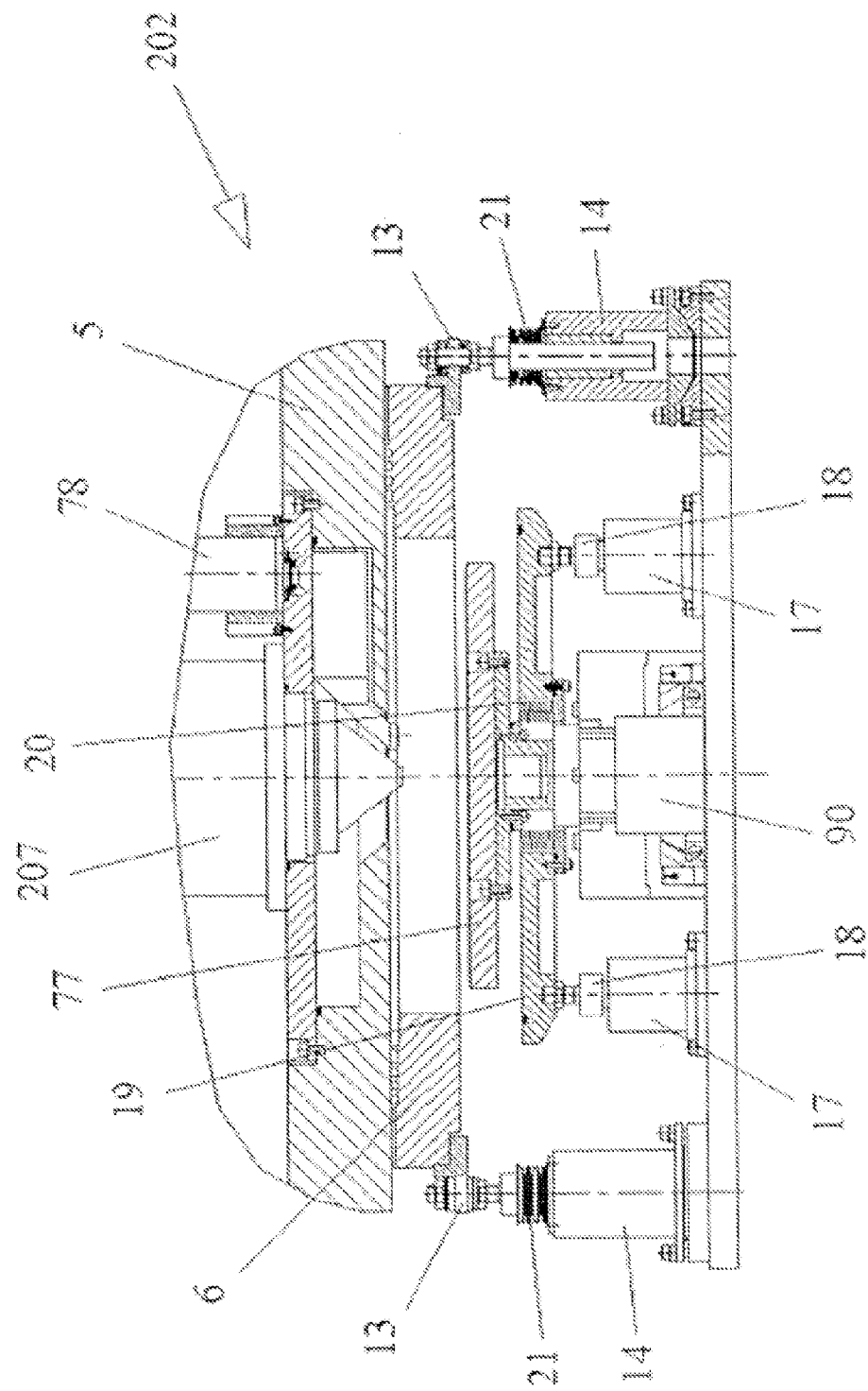

FIGS. 5 and 6 are cross sectional view of a portion of system 202 according to an embodiment of the invention. FIG. 5 illustrates a closed chamber while FIG. 6 illustrates the chamber when in the load position.

In system 202 the outer floating element 6 is maintained close to the upper plate 5 and the floating inner element 19 can move (in the vertical direction) in relation to the outer floating element 6. The outer floating element 6, the floating inner element 19 and the upper plate 5 may define the chamber.

An outer edge of the floating inner element 19 is closer to the center of the chamber than the outer edge of the outer floating element 6. FIG. 5 illustrates the outer edge of the floating inner element 19 as positioned much closer to the inner edge of the outer floating element 6 than the outer edge of the outer floating element 6.

When the chamber is closed, the floating inner element 19 can contact the outer floating element 6 but this is not necessarily so and the interface between these elements can be sealed in other manners, such as by a dynamic seal.

When the chamber is in a load position the device can be loaded or unloaded (to the chamber and from the chamber) by utilizing the gap between the floating inner element 19 and the outer floating element 6.

FIG. 5 illustrates multiple height changing elements such as z-stage 90, guided slide units 14, and actuators 17 that are spaced apart from each other. FIG. 5 illustrates the actuators 17 as being positioned closer to the z-stage 90 than the guided slide units 14. It is noted that the number of height changing elements and the distance between these height changing elements can differ from those illustrated in FIG. 5. For example, FIG. 7 illustrates a system in which the z-stage 90 and the actuators 14 are proximate to each other and even integrated together.

The height of the floating inner element 19 can be changed by multiple actuators 17 that are connected to kinematic joints 18, The floating inner element 19 can be shaped as a plate but this is not necessarily so. The center of the floating inner element 19 can define an aperture through which a rod 80 of the z-stage 90 may enter. The gap between the rod 80 of the z-stage 90 and the aperture can be sealed in various manners. A non-limiting example can include a dynamic seal. Such a sealing can be applied to rods of other z-stages of any of the systems mentioned above.

The outer floating element 6 can be supported by multiple (at least three or at least two) guided slide units 14. A rod of a guided slide unit can be surrounded by one or more annular springs (that contact the connection brackets 13) that may provide a suspension of the outer floating element 6 when the first dynamic seal (air bearing) does not operate.

When the chamber is closed (and when the device within the chamber is inspected, measured or processed) the vacuum force within the chamber can be a maximum, while when the chamber is in a load position the chamber can be at the same pressure level as its environment—even if the gas is still pumped out from the vacuum grooves.

The device supporting element 77 can be elevated within the chamber by z-stage 90. The device supporting element 77 can be connected to the floating inner element 19 by bellows 20 that maintains the chamber sealed even when the device supporting element 77 moves in relation to the floating inner element 19. The vertical movements of the device supporting element 77 and floating inner element 19 can be controlled to reduce unwanted movements between these elements. For example, both the device supporting element 77 and the floating inner element 19 can be elevated when the chamber is being closed.

Figure 7A:
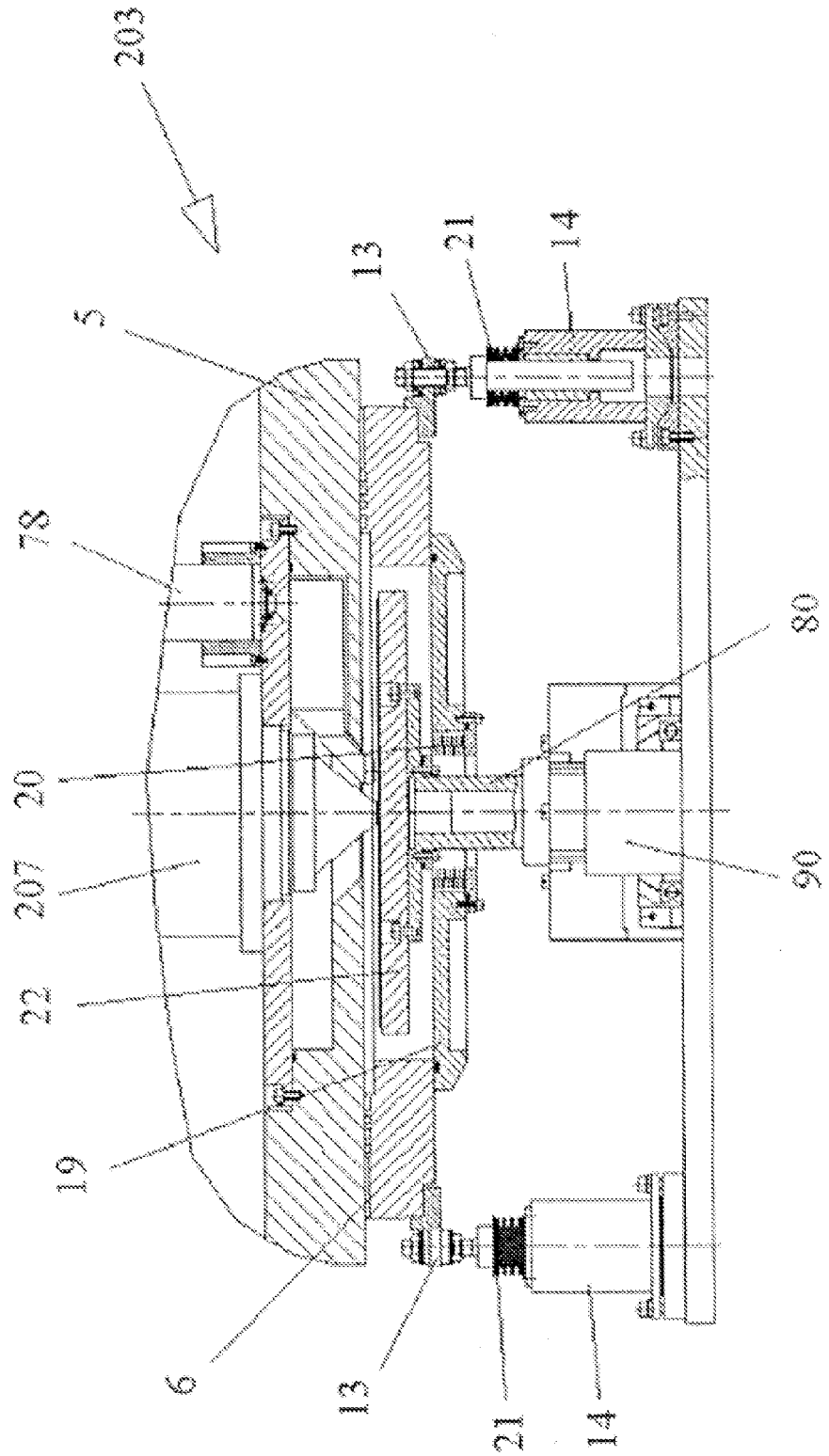
FIGS. 7A and 7B are a cross sectional views of a system according to an embodiment of the invention.

FIG. 7A is a cross sectional view of a portion of system 203 according to an embodiment of the invention. System 203 differs from system 202 of FIGS. 5 and 6 by having a z-stage that can change the vertical position of each of the device supporting element 77 and the floating inner element 19. Thus, both the device supporting element 77 and floating inner element 19 can be elevated when the chamber is being closed and both can be lowered when the chamber is being opened. Additionally, the device supporting element 77 can be elevated and lowered within the chamber when the floating inner element 19 is at its highest position and the chamber is closed.

In addition to acting as a sealing element, the bellows 20 can play the role of an elastic suspension element. In this case the floating inner element may connect only to the bellows 20, which is mounted on the rod 80 of the Z-stage 90. When the supporting element 77 is in its working position, the floating inner element 19 is stayed on the lower surface of the outer floating element 6 and provides the sealing of the internal volume of element 6 from the atmospheric environment. In this condition, the bellows have tension that provide the preload in the contact between floating inner element 19 and the outer floating element 6.

Figure 7B:
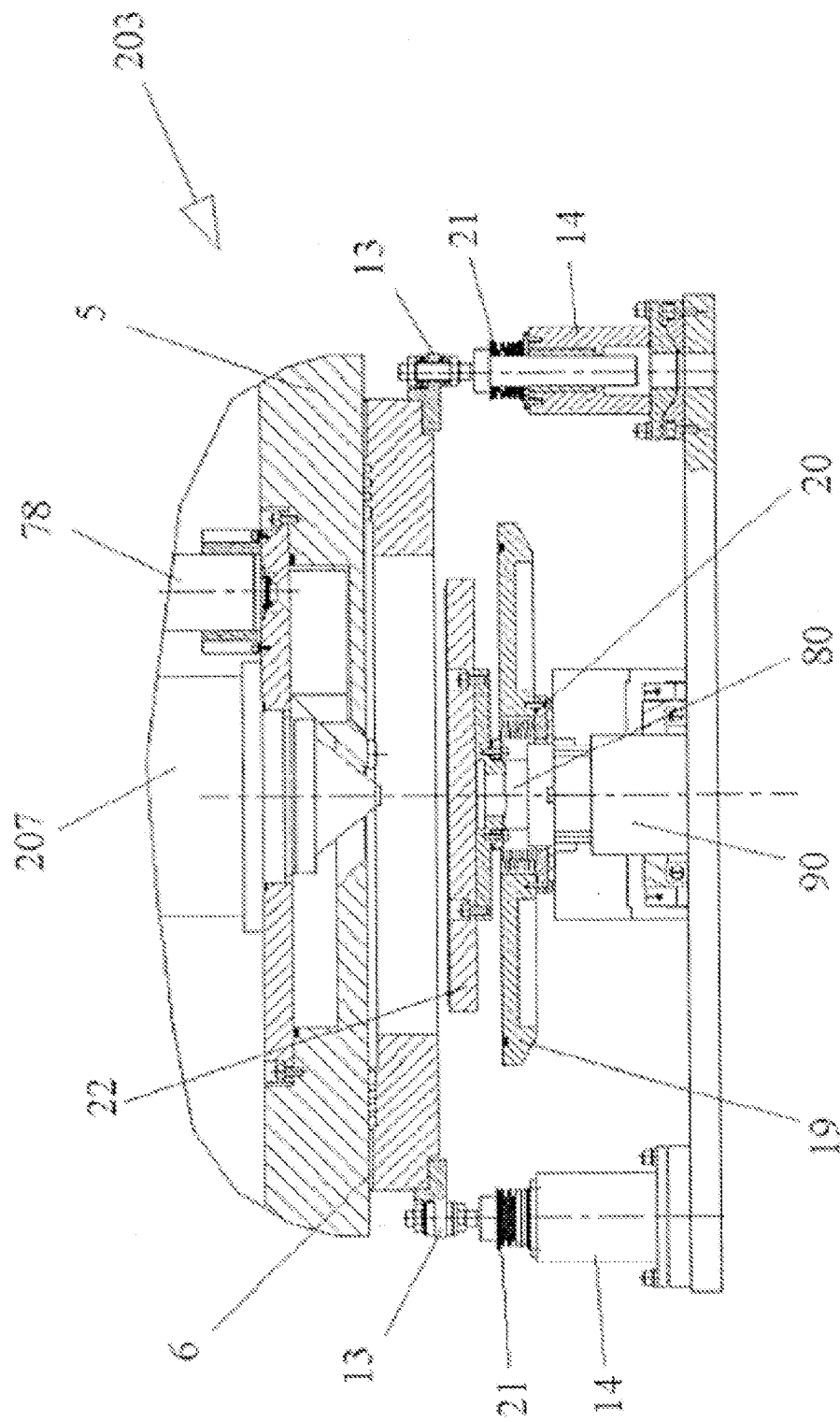

FIG. 7A illustrates a closed chamber while FIG. 7B illustrates the chamber when in the load position. In the load position the bellows hold the floating inner element 19, which is in free condition.

According to various embodiments of the invention the movement system can include the load mechanism but this is not necessarily so and the movement system can differ from the load mechanism.

Referring to each of the previous figures, the number of height changing elements of the movement system and additionally or alternatively of the load mechanism can differ from one, to two, to three, and can exceed three. The same applies to the location of these height changing elements, they may distributed in a symmetrical, asymmetrical or other fashion.

Figure 8:
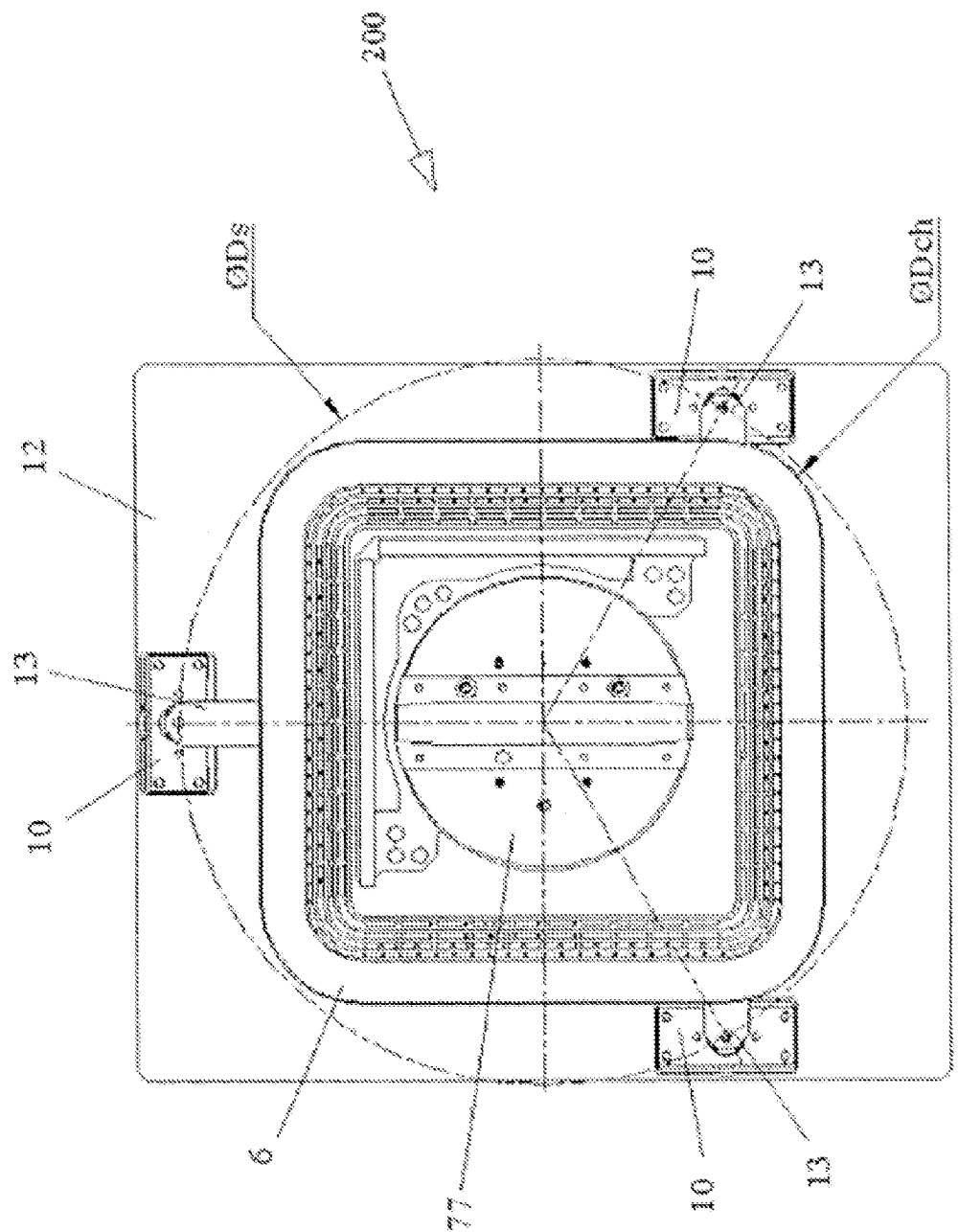
FIG. 8 is a top view of a system according to an embodiment of the invention.

FIG. 8 is a top view of system 200 according to an embodiment of the invention. For simplicity of explanation various components such as the SEM, the optical microscope and other measurement elements are not shown. FIG. 8 illustrates an example of the spatial relationship between the outer floating element 6, connection brackets 13 and three guided pneumatic cylinders 10.

The centers of the three guided pneumatic cylinders 10 are located on an imaginary circle that has a diameter of Dch. These three guided pneumatic cylinders 10 are positioned in a symmetrical manner forming an angle of about 120 degrees to one another as determined by imaginary radiuses of this imaginary circle. Diameter Dch can be larger than the diagonal of the outer floating element 6. It is noted that the imaginary circuit can fully surround the outer floating element 6 but this is not necessarily so.

This feature may allow the chamber to be closed with no collision between the first and second surfaces even the pneumatic actuators move no synchronously.

FIG. 9 is a cross sectional view of portions of the first and second surfaces 91 and 92 according to an embodiment of the invention.

The outer floating element 6 can move in relation to the upper plate 5 and the second surface should be large enough to face the first surface 91 regardless of the location of the outer floating element 6.

In one implementation, the outer floating element 6 has an air bearing annular groove 501, a first pressure (in one embodiment, atmospheric pressure) annular groove 502, second and third pressure (in one embodiment, relatively low vacuum) annular grooves 503 and 504, respectively, and a fourth pressure (in one embodiment, relatively high vacuum) annular groove 505. These elements provide an integral dynamic seal.

In one embodiment, the grooves are arranged so that they provide seals for increasing levels of vacuum going from outside the chamber to inside the chamber, so that the chamber in this embodiment is at a relatively high vacuum. However, it will be appreciated by those skilled in the art that the arrangement of the grooves, and their order, will depend on the application, the relative pressure differential inside and outside the chamber, and the like. It also will be appreciated that the number of grooves is not critical, but may be varied as desired.

Each plenum, annular grooves 502, 503, 504, and 505, and its isolating land act to remove residual gas from the air bearing annular groove 501 until the required level of isolation is achieved at the seal interface. One or more exhaust conduits (not shown), which may be similar to the exhaust ports in the gas exhaust system disclosed in the commonly assigned U.S. Pat. No. 6,163,033, are coupled to each plenum to remove the residual gas. The conduits are connected to one or more vacuum pumps (not shown). The vacuum pumps may be operated separately, or under the control of a system controller. The necessary number of plenum stages depends upon the level of vacuum required and the pumping rate of the vacuum pumps in conjunction with the precision of the air bearing gap.

In another implementation, the groove structure 501-505 is provided on the upper plate 5, rather than on the outer floating element 6. As discussed above, each plenum, vacuum annular grooves 502-505, and its isolating land act to remove residual gas from the air bearing annular groove 501 until the required level of isolation is achieved at the seal interface. The presence of the groove and land structure on the outer floating element 6, as opposed to the upper plate 5, is not important; it is the achievement of the seal that is important.

Figure 10A:
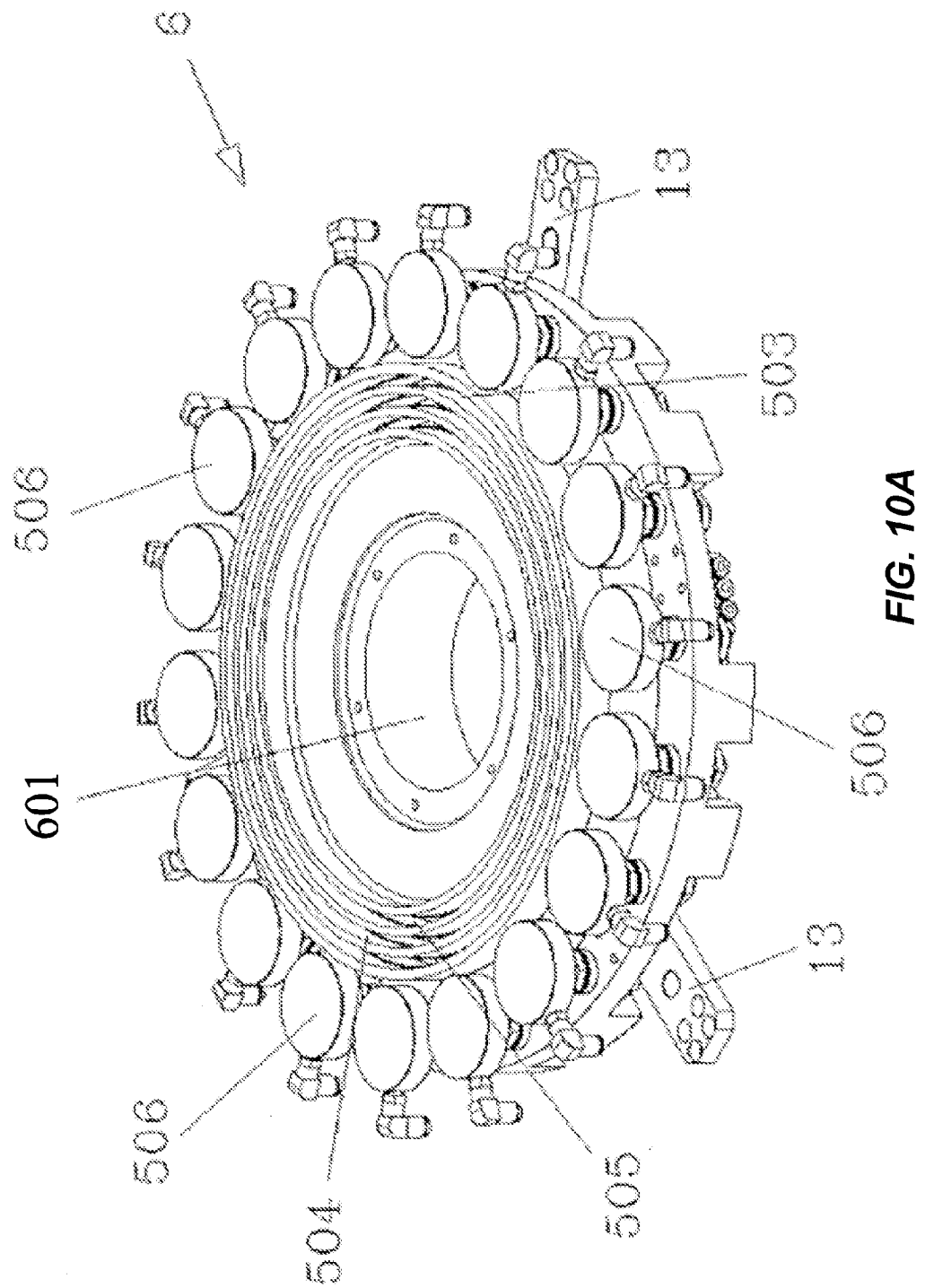
FIGS. 10A and 10B illustrates outer floating elements according to embodiments of the invention.

FIG. 10A illustrates an outer floating element 6 according to an embodiment of the invention. The outer floating element 6 is shaped as a ring and defines an inner circular aperture 601. The inner circular aperture 601 is surrounded by three annular grooves 503, 504 and 505. These three annular grooves 503, 504 and 505 are surrounded by a group of air bearings 506 that are arranged along an imaginary circle that surrounds the three plenums, annular grooves 503, 504 and 505. The air bearings 506 can be standard air bearings and can reduce the cost of the system.

Figure 10B:
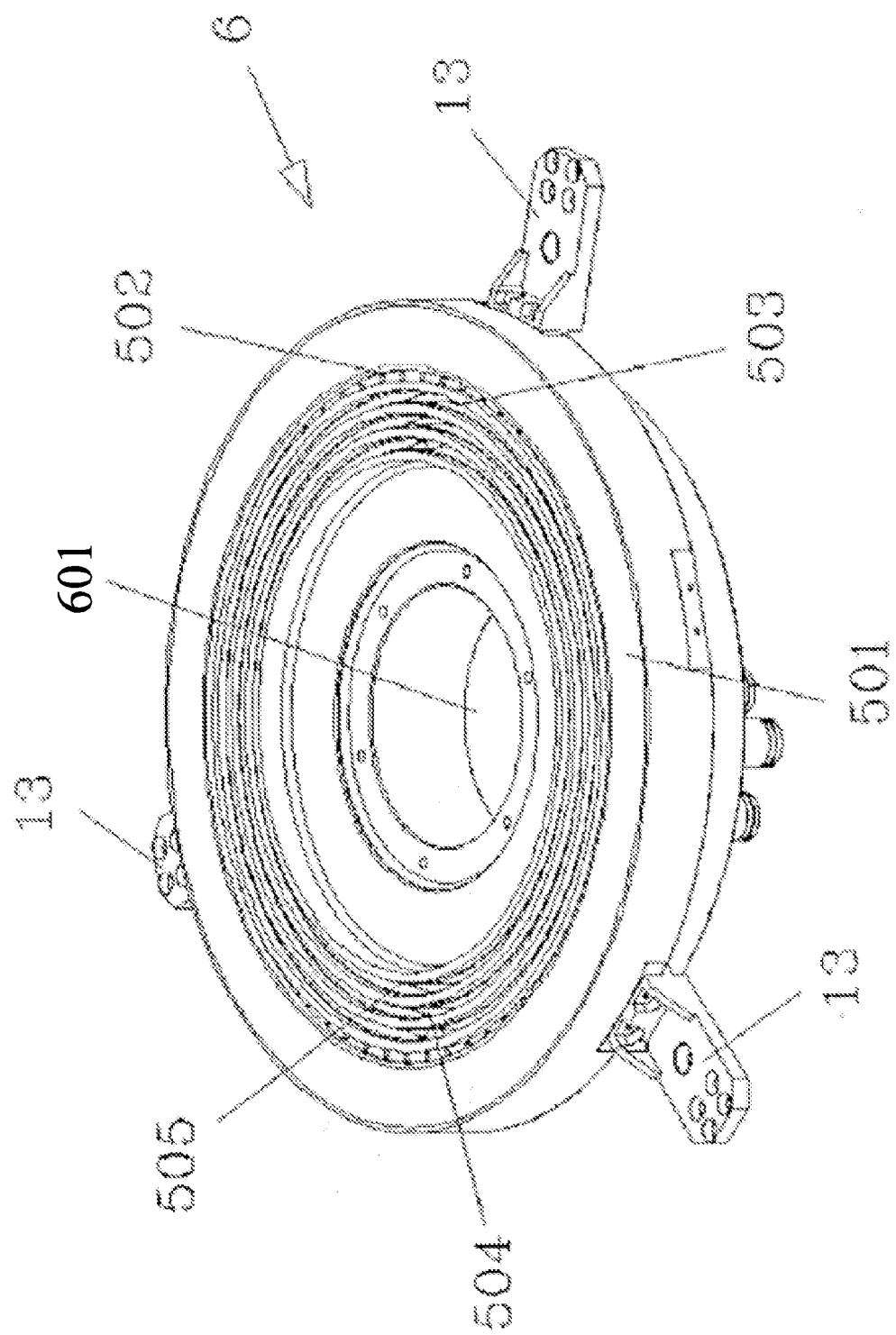

FIG. 10B illustrates an outer floating element 6 according to another embodiment of the invention. The outer floating element 6 is shaped as a ring and defines an inner circular aperture 301. The inner circular aperture 601 is surrounded by five annular grooves 501-505. Vacuum annular grooves 502-505 are surrounded by the air bearing annular groove 501.

Figure 11:
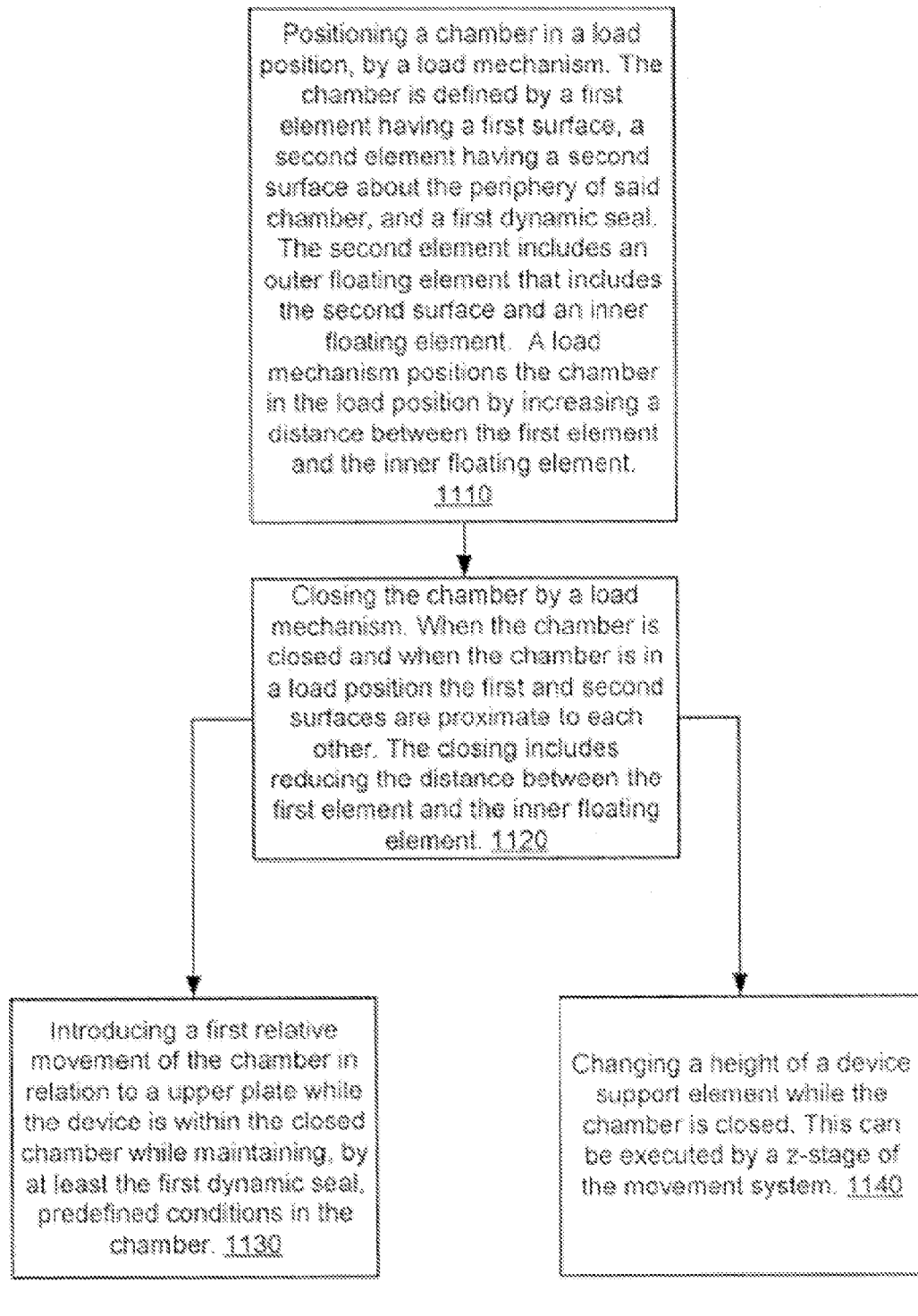
FIG. 11 illustrates a method according to an embodiment of the invention.

FIG. 11 illustrates method 1100 according to an embodiment of the invention.

Method 1100 starts at 1110, with the positioning a chamber in a load position, by a load mechanism. The chamber is defined by a first element having a first surface, a second element having a second surface about the periphery of said chamber, and a first dynamic seal. The second element includes an outer floating element that includes the second surface and an inner floating element. A load mechanism positions the chamber in the load position by increasing a distance between the first element and the inner floating element.

Step 1110 is followed by, 1120 in which the chamber is closed by a load mechanism. When the chamber is closed and when the chamber is in a load position the first and second surfaces are proximate to each other. The closing includes reducing the distance between the first element and the inner floating element.

Step 1120 is followed by 1130, in which a movement system introduces a first relative movement of the chamber in relation to an upper plate while the device is within the closed chamber while maintaining, by at least the first dynamic seal, predefined conditions in the chamber. The movement system may include multiple actuators that are arranged to move the inner floating element. The multiple actuators surround a z-stage of the movement system.

Alternatively or in addition, step 1120 may be followed by 1140, in which the height of a device support element is changed while the chamber is closed. This can be executed by a z-stage of the movement system.

Figure 12:
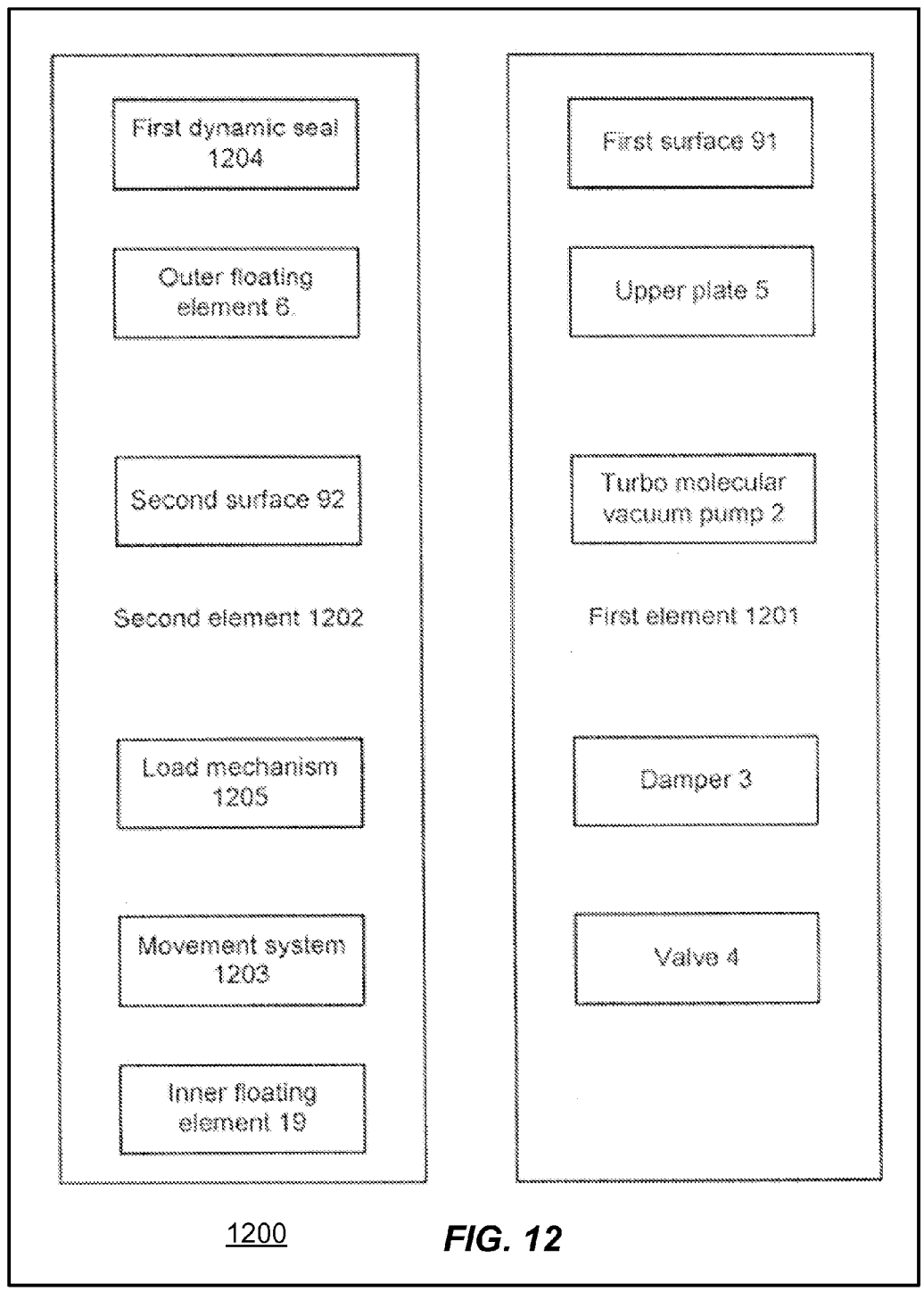
FIG. 12 illustrates various chamber elements according to an embodiment of the invention.

FIG. 12 illustrates a system 205 according to an embodiment of the invention.

System 205 includes: chamber 1200 that includes a first element 1201 having a first surface 91, and a second element 1202 having a second surface 92 about the periphery of said chamber. The first element 1201 may further include the upper plate 5 and the second element 1202 may further include the outer floating element 6.

The first element 1201 may additionally include a turbo molecular vacuum pump 2 for pumping the chamber 1200, a damper 3, a valve 4, and the like.

The second element 1202 may further include a first dynamic seal 1204, a load mechanism 1205, an inner floating element 19, and a movement system 1203, such as an XYZ stage or a portion thereof.

The movement system 1203 may be arranged to generate a first relative movement between the first element 1201 and the second element 1202.

When the chamber 1200 is closed, the first dynamic seal is arranged to maintain predefined conditions in the chamber during the first relative movement. When the chamber is in the load position, loading of a device to the chamber and unloading of a device from the chamber are facilitated.

The second surface 92 and the first surface 91 are maintained proximate to each other when the chamber 1200 is in the load position and when the chamber 1200 is closed.

The load mechanism 1205 is arranged to move the inner floating element 19 from the outer floating element 6 until a gap between the inner floating element 19 and the second element 1202 facilitates a loading of the device to the chamber 1200.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. Chamber elements defining a chamber to be utilized during a stage selected from a group consisting of a manufacturing stage of a device and an inspection stage of the device, the chamber elements comprising:
   a first element having a first surface;
   a second element having an outer floating element that comprises a second surface about a periphery of said chamber, and further having an inner floating element;
   a first dynamic seal arranged to maintain predefined conditions in said chamber during relative movement between said first element and said second element when said chamber is closed; and
   a load mechanism, arranged to position the chamber in a load position in which the inner floating element is moved from the outer floating element until a gap exists between an upper surface of the inner floating element and a bottom surface of the outer floating element, the gap allowing loading of the device to the chamber or unloading of the device from the chamber, and arranged to close the chamber, the second surface and the first surface being maintained proximate to each other when the chamber is in the load position and when the chamber is closed;
   wherein the chamber elements are operable to partially surround a first portion of a movement system, said movement system arranged to generate said relative movement between said first element and said second element.

2. The chamber elements according to claim 1 wherein the second element comprises a device support element; and the movement system comprises a z-stage arranged to alter a height of the device support element within the chamber when the chamber is closed.

3. The chamber elements according to claim 2 wherein the movement system further comprises multiple actuators that are arranged to move the inner floating element, the multiple actuators surrounding the z-stage.

4. The chamber elements according to claim 1 wherein the load mechanism comprises supporting elements that place the outer floating element in proximity to the first element.

5. The chamber elements according to claim 1 wherein the movement system comprises the load mechanism.

6. The chamber elements according to claim 1 wherein the load mechanism is separate from the movement system.

7. The chamber elements according to claim 1 wherein the first dynamic seal is maintained by a flow of gas between a group of air bearings and multiple vacuum grooves; wherein the group of air bearings surround the multiple vacuum grooves.

8. The chamber elements according to claim 1 wherein the first dynamic seal is maintained by a flow of gas between a vacuum groove and multiple vacuum grooves, wherein the vacuum groove surrounds the multiple vacuum grooves.

9. Chamber elements defining a chamber to be utilized during a stage selected from a group consisting of a manufacturing stage of a device and an inspection stage of the device, the chamber elements comprising:
   a first element having a first surface;
   a second element having a second surface about a periphery of the chamber, wherein the second element comprises an inner floating element and an outer floating element that comprises the second surface;
   a first dynamic seal; and
   a load mechanism, arranged to position the chamber in a load position in which loading of the device to the chamber and unloading of the device from the chamber are facilitated, and arranged to close the chamber, the load mechanism comprising at least one of an adjustable height element and a closed loop height adjustment element,
   wherein the chamber elements are operable to partially surround a first portion of a movement system arranged to generate a first relative movement between said first element and said second element, the first dynamic seal being arranged to maintain predefined conditions in the chamber during the first relative movement, and when the chamber is closed, the first and second surfaces are proximate to each other; and
   wherein the load mechanism is arranged to move the inner floating element from the outer floating element until a gap exists between an upper surface of the inner floating element and a bottom surface of the outer floating element to facilitate loading of the device to the chamber.

10. The chamber elements according to claim 9 wherein the load mechanism is arranged to increase a distance between the first and second surfaces until the chamber is in the load position.

11. The chamber elements according to claim 9 further comprising a vacuum unit arranged to introduce a pressure difference between the chamber and an environment of the chamber.

12. The chamber elements according to claim 9 wherein:
   the first dynamic seal is arranged to maintain the predefined conditions when a distance between the first and second surfaces is smaller than a first distance;
   the load mechanism is arranged to place the first and second surfaces at the first distance from each other; and a pressure difference between the chamber and an environment of the chamber causes the first surface to move closer than the first distance from the second surface.

13. The chamber elements according to claim 12 wherein:
the load mechanism comprises a cylinder and the adjustable height element;
a first end of the adjustable height element is connected to the cylinder and a second end of the adjustable height element is connected to the bottom surface; and
a distance between the first and second ends of the adjustable height element is adjustable.

14. The chamber elements according to claim 9 wherein:
the load mechanism comprises a cylinder and the adjustable height element;
a first end of the adjustable height element is connected to the cylinder and a second end of the adjustable height element is connected to the bottom surface; and
a distance between the first and second ends of the adjustable height element is adjustable.

15. The chamber elements according to claim 14 wherein the cylinder comprises a piston and an elastic stop that is positioned to prevent the piston from elevating the first element so as to cause the first surface to contact the second surface.

16. The chamber according to claim 9 wherein the load mechanism is responsive to distance measurements made by a sensor that is arranged to sense distances between the first and second surfaces.

17. The chamber according to claim 16 wherein the load mechanism comprises an electro-mechanical actuator that is responsive to distance measurements.

18. The chamber elements according to claim 9 wherein the first element comprises an upper plate, a base, and a vibration isolation system having a first end mounted to the base and a second end mounted to the upper plate, supporting the upper plate and isolating the upper plate from vibration.

19. The chamber elements according to claim 9 wherein the load mechanism comprises multiple distance changing elements that surround the chamber.

20. The chamber elements according to claim 9 wherein the second surface and the first surface are maintained proximate to each other when the chamber is in the load position.

21. A method for loading a device into a chamber during processing or inspecting of the device, said method comprising:
positioning a chamber in a load position, wherein the chamber is defined by a first element having a first surface and a second element including an inner floating element and an outer floating element that comprises a second surface about a periphery of the chamber, the second element operable to partially surround a first portion of a movement system arranged to generate relative movement between the first element and the second element; and wherein a gap exists between an upper surface of the inner floating element and a bottom surface of the outer floating element in the load position to facilitate loading of the device to the chamber; and
closing the chamber by a load mechanism, wherein when the chamber is closed and when the chamber is in the load position the first and second surfaces are proximate to each other and a first dynamic seal is arranged to maintain predefined conditions in the chamber during the relative movement between the first element and the second element.

* * * * *